(12) United States Patent
Karalkar et al.

(10) Patent No.: US 11,776,952 B1
(45) Date of Patent: Oct. 3, 2023

(54) SILICON-CONTROLLED RECTIFIERS FOR AN ELECTROSTATIC DISCHARGE PROTECTION DEVICE

(71) Applicant: GlobalFoundries U.S. Inc., Malta, NY (US)

(72) Inventors: Sagar Premnath Karalkar, Essex Junction, VT (US); Jie Zeng, Singapore (SG); Milova Paul, Singapore (SG); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/737,272

(22) Filed: May 5, 2022

(51) Int. Cl.
    *H01L 27/02* (2006.01)
    *H01L 29/74* (2006.01)
    *H01L 29/66* (2006.01)

(52) U.S. Cl.
    CPC .... *H01L 27/0262* (2013.01); *H01L 29/66363* (2013.01); *H01L 29/74* (2013.01)

(58) Field of Classification Search
    None
    See application file for complete search history.

(56) References Cited

U.S. PATENT DOCUMENTS

| | | | |
|---|---|---|---|
| 7,061,051 B2 | 6/2006 | Yu | |
| 7,202,114 B2 | 4/2007 | Salcedo et al. | |
| 8,138,546 B2 | 3/2012 | Gauthier, Jr. et al. | |
| 9,318,479 B2 | 4/2016 | Li et al. | |
| 9,451,669 B2 | 9/2016 | Werner et al. | |
| 10,366,975 B1* | 7/2019 | Zeng | H01L 23/60 |
| 2022/0190106 A1* | 6/2022 | Nidhi | H01L 29/7823 |

OTHER PUBLICATIONS

Z. Wang et al, "No-Snapback Silicon-Controlled Rectifier for Electrostatic Discharge Protection of High-Voltage ICs," in IEEE Electron Device Letters, vol. 36, No. 11, pp. 1121-1123, doi: 10.1109/LED.2015.2479612 (Nov. 2015).

* cited by examiner

*Primary Examiner* — Wasiul Haider
(74) *Attorney, Agent, or Firm* — Thompson Hine LLP; Francois Pagette

(57) ABSTRACT

Structures for a silicon-controlled rectifier and methods of forming a structure for a silicon-controlled rectifier. The structure includes first and second wells in the semiconductor substrate, a first terminal including a first doped region in the first well, and a second terminal including a second doped region in the second well. The first well and the second doped region have a first conductivity type, and the second well and the first doped region have a second conductivity type opposite to the first conductivity type. First and second conductor layers are positioned on the semiconductor substrate. The first conductor layer partially overlaps with the first well, and the second conductor layer partially overlaps with the second well. A third doped region, which has the second conductivity type, is laterally positioned in the semiconductor substrate between the first and second conductor layers.

20 Claims, 3 Drawing Sheets

SILICON-CONTROLLED RECTIFIERS FOR AN ELECTROSTATIC DISCHARGE PROTECTION DEVICE

BACKGROUND

The disclosure relates generally to semiconductor devices and integrated circuit fabrication and, more specifically, to structures for a silicon-controlled rectifier and methods of forming a structure for a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed to the integrated circuit. An ESD event may occur during post-manufacture chip handling or after chip installation on a circuit board or other carrier. The high current may originate from a variety of sources, such as the human body, a machine component, or a chip carrier.

Precautions may be taken to protect the integrated circuit from an ESD event. One such precaution is to incorporate an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and shunts the ESD current away from the integrated circuit. The protection device remains clamped in its low-impedance state until the ESD current is drained and the ESD voltage is discharged to an acceptable level.

A common type of protection device commonly deployed in an ESD protection circuit is a silicon-controlled rectifier (SCR). In its quiescent state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped to conduct the forward current so long as the forward current remains above an engineered holding current. When the forward current from the ESD event drops below the holding current, the SCR returns to its quiescent state.

Improved structures for a silicon-controlled rectifier and methods of forming a structure for a silicon-controlled rectifier are needed.

SUMMARY

In an embodiment, a structure for a silicon-controlled rectifier is provided. The structure comprises a semiconductor substrate, a first well in the semiconductor substrate, a second well in the semiconductor substrate, a first terminal including a first doped region in the first well, and a second terminal including a second doped region in the second well. The first well and the second doped region have a first conductivity type, and the second well and the first doped region have a second conductivity type opposite to the first conductivity type. The structure further includes a first conductor layer and a second conductor layer on the semiconductor substrate. The first conductor layer includes a portion overlapping with the first well, and the second conductor layer includes a portion overlapping with the second well. The structure further includes a third doped region in the semiconductor substrate. The third doped region, which has the second conductivity type, is positioned in a lateral direction between the first conductor layer and the second conductor layer.

In an embodiment, a method of forming a structure for a silicon-controlled rectifier is provided. The method comprises forming a first well in a semiconductor substrate, forming a second well in the semiconductor substrate, forming a first terminal including a first doped region in the first well, and forming a second terminal including a second doped region in the second well. The first well and the second doped region have a first conductivity type, and the second well and the first doped region have a second conductivity type opposite to the first conductivity type. The method further comprises forming a first conductor layer and a second conductor layer on the semiconductor substrate. The first conductor layer includes a portion overlapping with the first well, and the second conductor layer includes a portion overlapping with the second well. The method further comprises forming a third doped region in the semiconductor substrate. The third doped region has the second conductivity type, and the third doped region is positioned in a lateral direction between the first conductor layer and the second conductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
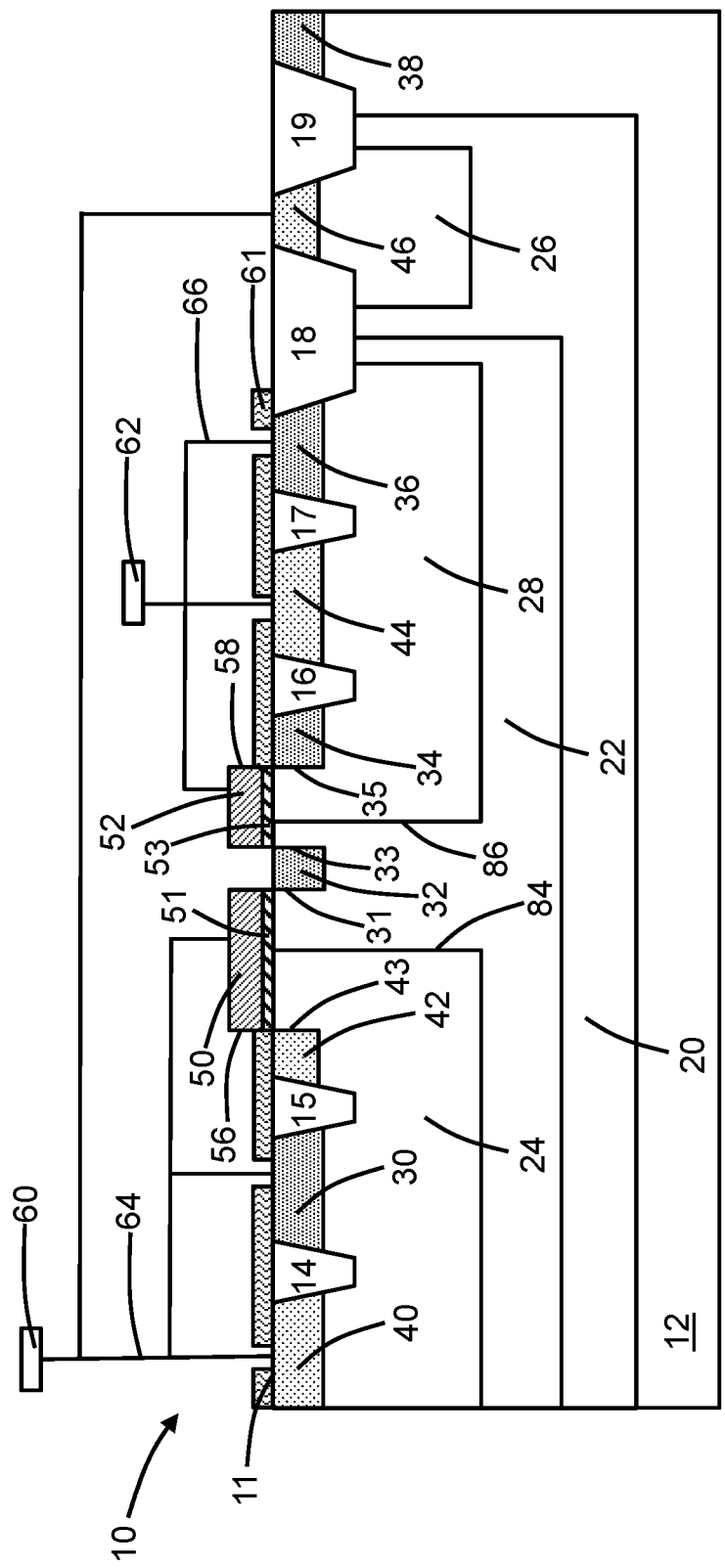
FIG. 1 is a cross-sectional view of a structure in accordance with embodiments of the invention.

With reference to FIG. 1 and in accordance with embodiments of the invention, a structure 10 for a silicon-controlled rectifier includes a semiconductor substrate 12 that may be comprised of a semiconductor material, such as single-crystal silicon. In an embodiment, the semiconductor substrate 12 may be doped to have p-type conductivity. Shallow trench isolation regions 14, 15, shallow trench isolation regions 16, 17, and shallow trench isolation regions 18, 19 are arranged in the semiconductor substrate 12. The shallow trench isolation region 14 is positioned adjacent to the shallow trench isolation region 15, the shallow trench isolation region 16 is positioned adjacent to the shallow trench isolation region 17, and the shallow trench isolation region 18 is positioned adjacent to the shallow trench isolation region 19. The shallow trench isolation regions 14, 15, shallow trench isolation regions 16, 17, and shallow trench isolation regions 18, 19 may be formed by patterning shallow trenches in the semiconductor substrate 12 with lithography and etching processes, depositing a dielectric material, such as silicon dioxide, to fill the shallow trenches, and planarizing and/or recessing the deposited dielectric material.

A deep well 20 is formed within the semiconductor substrate 12. The deep well 20 is doped to have an opposite conductivity type from the semiconductor substrate 12. The deep well 20 may be formed by introducing a dopant by, for example, ion implantation into the semiconductor substrate 12. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the deep well 20. The implantation mask has a thickness and stopping power sufficient to block implantation in masked areas. Implantation conditions (e.g., ion species, dose, kinetic energy) may be selected to tune the electrical and physical characteristics of the deep well 20. In an embodiment, the deep well 20 may be doped with a concentration of an n-type dopant (e.g., arsenic or phosphorus) to provide n-type conductivity. In an embodiment, the deep well 20 may contain an n-type dopant concentration in a range of about $5 \times 10^{15}$ cm$^{-3}$ to about $5 \times 10^{16}$ cm$^{-3}$.

A well 22 is formed in the semiconductor substrate 12. The well 22 is positioned in a vertical direction between the top surface 11 of the semiconductor substrate 12 and a portion of the deep well 20. The well 22 is doped to have a conductivity type that is opposite to the conductivity type of the deep well 20 and the same conductivity type as the semiconductor substrate 12. In an embodiment, the well 22 may be doped with a concentration of a p-type dopant (e.g., boron) to provide p-type conductivity. In an embodiment, the well 22 may contain a p-type dopant concentration in a range of about $1 \times 10^{16}$ cm$^{-3}$ to about $1 \times 10^{17}$ cm$^{-3}$.

The well 22 may be formed by introducing a dopant by, for example, ion implantation into the semiconductor substrate 12. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the well 22. The implantation mask has a thickness and stopping power sufficient to block implantation in masked areas. The implantation conditions (e.g., ion species, dose, kinetic energy) may be selected to tune the electrical and physical characteristics of the well 22.

Wells 24, 26 are formed in the semiconductor substrate 12. The well 24 is positioned in a vertical direction between a portion of the well 22 and the top surface 11 of the semiconductor substrate 12. The well 24 is doped to have an opposite conductivity type to the well 22. The well 26, which is positioned in a portion of the deep well 20, is doped to have the same conductivity type as the deep well 20.

The wells 24, 26 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for implantation. The implantation mask may include a layer of an organic photoresist that is applied and patterned to form openings exposing the selected areas on the top surface 11 of the semiconductor substrate 12 and determining, at least in part, the location and horizontal dimensions of the wells 24, 26. The implantation mask has a thickness and stopping power sufficient to block implantation in masked areas. The implantation conditions (e.g., ion species, dose, kinetic energy) may be selected to tune the electrical and physical characteristics of the wells 24, 26. In an embodiment, the wells 24, 26 may be doped with a concentration of an n-type dopant (e.g., arsenic or phosphorus) to provide n-type conductivity. In an embodiment, the wells 24, 26 may contain an n-type dopant concentration in a range of about $1 \times 10^{17}$ cm$^{-3}$ to about $5 \times 10^{18}$ cm$^{-3}$.

A well 28 is formed in the semiconductor substrate 12. The well 28 is positioned in a vertical direction between a portion of the well 22 and the top surface 11 of the semiconductor substrate 12. The well 28 is doped to have the same conductivity type as the well 22. The well 28 may be formed by introducing a dopant of a given conductivity type by, for example, ion implantation into the semiconductor substrate 12. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the well 28. The implantation mask has a thickness and stopping power sufficient to block implantation in masked areas. The implantation conditions (e.g., ion species, dose, kinetic energy) may be selected to tune the electrical and physical characteristics of the well 28. In an embodiment, the well 28 may be doped with a concentration of a p-type dopant (e.g., boron) to provide p-type conductivity. In an embodiment, the well 28 may contain a p-type dopant concentration in a range of about $1 \times 10^{17}$ cm$^{-3}$ to about $5 \times 10^{18}$ cm$^{-3}$.

The well 28 is positioned in a lateral direction adjacent to the well 24, and well 28 is also positioned in a lateral direction between the well 24 and the well 26. A portion of the well 22 is positioned in a lateral direction between the well 24 and the well 28 such that the well 28 does not adjoin the well 24. This portion of the well 22 separating the wells 24, 28 intersects the top surface 11 of the semiconductor substrate 12. The well 28 is also positioned in a lateral direction adjacent to the well 26 with portions of both wells 20, 22 separating the well 28 from the well 26.

Conductive layers 50, 52 are formed on the top surface 11 of the semiconductor substrate 12 and are positioned in a vertical direction above the top surface 11. The conductive layer 50 is formed in a layer stack that includes a dielectric layer 51 positioned between the conductive layer 50 and the top surface 11. The conductive layer 52 is formed in a layer stack that includes a dielectric layer 53 positioned between the conductive layer 52 and the top surface 11. In an embodiment, the conductive layers 50, 52 may be comprised of doped polysilicon, and the dielectric layers 51, 53 may be comprised of silicon dioxide. The conductive layer 50 and dielectric layer 51 overlap with a portion of the well 24, a portion of the well 22, and an interface 84 between the well 24 and the well 22. The conductive layer 52 and the dielectric layer 53 overlap with a portion of the well 28, a portion of the well 22, and an interface 86 between the well 28 and the well 22. The conductive layer 50 has an outer sidewall 56 that extends about its perimeter, and the conductive layer 52 has an outer sidewall 58 that extends about its perimeter.

Doped regions 30, 32, 34, 36, 38 are formed adjacent to the top surface 11 of the semiconductor substrate 12. The doped region 30 is positioned in the well 24 between the shallow trench isolation region 14 and the shallow trench isolation region 15, and the doped region 30 is doped to have an opposite conductivity type from the well 24. The doped region 32 is positioned in the portion of the well 22 that separates the well 24 from the well 28, and the doped region 32 is doped to have the same conductivity type as the well 22 but at a higher dopant concentration. The doped region 34 and the doped region 36 are positioned in the well 28, and the doped regions 34, 36 are doped to have the same conductivity type as the well 28 but at a higher dopant concentration. The doped region 38 is positioned in a portion of the semiconductor substrate 12 that is accessible at the top surface 11, and the doped region 38 is doped to have the same conductivity type as the semiconductor substrate 12 but at a higher dopant concentration.

In an embodiment, the doped regions 30, 32, 34, 36, 38 may be doped (e.g., heavily doped) with a concentration of a p-type dopant (e.g., boron) to provide p-type conductivity. In an embodiment, the doped regions 30, 32, 34, 36, 38 may contain a p-type dopant concentration in a range of about $1 \times 10^{19}$ cm$^{-3}$ to about $5 \times 10^{20}$ cm$^{-3}$. The doped regions 30, 32, 34, 36, 38 may be concurrently formed by selectively implanting ions, such as ions including the p-type dopant, under given implantation conditions with an implantation mask having openings defining the intended locations for the doped regions 30, 32, 34, 36, 38 in the semiconductor substrate 12.

Doped regions 40, 42, 44, 46 are adjacent to the top surface 11 of the semiconductor substrate 12. The doped region 40 and the doped region 42 are positioned in the well 24, and the doped regions 40, 42 are doped to have the same conductivity type as the well 24 but at a higher dopant concentration. The doped region 30 is positioned in a lateral direction between the doped region 40 and the doped region 42. The shallow trench isolation region 14 is positioned between the doped region 40 and the doped region 30, and the shallow trench isolation region 15 is positioned between the doped region 42 and the doped region 30. The doped region 42 may adjoin the shallow trench isolation region 15. The doped region 44 is positioned in the well 28, and the doped region 44 is doped to have an opposite conductivity type from the well 28. The doped region 44 is positioned in a lateral direction between the shallow trench isolation region 16 and the shallow trench isolation region 17. The shallow trench isolation region 16 is positioned in a lateral direction between the doped region 34 and the doped region 44, and the shallow trench isolation region 17 is positioned in a lateral direction between the doped region 36 and the doped region 44. The doped region 34 may adjoin the shallow trench isolation region 16. The doped region 46 is positioned in the well 26, and the doped region 46 is doped to have the same conductivity type as the well 26 but at a higher dopant concentration.

In an embodiment, the doped regions 40, 42, 44, 46 may be doped (e.g., heavily doped) with a concentration of an n-type dopant (e.g., arsenic or phosphorus) to provide n-type conductivity. In an embodiment, the doped regions 40, 42, 44, 46 may contain an n-type dopant concentration in a range of about $1 \times 10^{19}$ cm$^{-3}$ to about $5 \times 10^{20}$ cm$^{-3}$. The doped regions 40, 42, 44, 46 may be concurrently formed by selectively implanting ions, such as ions including the n-type dopant, under given implantation conditions with an implantation mask having openings defining the intended locations for the doped regions 40, 42, 44, 46 in the semiconductor substrate 12.

The conductive layers 50, 52 may be present on the top surface 11 of the semiconductor substrate 12 during the formation of the doped regions 30, 32, 34, 36, 38 and also during the formation of the doped regions 40, 42, 44, 46. The doped region 42 is positioned adjacent to the conductive layer 50. In an embodiment, the doped region 42 includes a side edge 43 that may be aligned to a portion of the sidewall 56 of the conductive layer 50. The doped region 34 is positioned adjacent to the conductive layer 52. In an embodiment, the doped region 34 includes a side edge 35 that is aligned to the sidewall 58 of the conductive layer 52. The doped region 32 is positioned in a lateral direction between the sidewall 56 and the sidewall 58. In an embodiment, the doped region 32 includes a side edge 31 that may be aligned to the sidewall 56 of the conductive layer 50 and a side edge 33 that may be aligned to the sidewall 58 of the conductive layer 52.

Middle-of-line processing and back-end-of-line processing follow, which includes formation of an interconnect structure with electrical connections coupled to the structure 10. A self-aligned silicide layer may be formed on the top surface 11 of the semiconductor substrate 12, and a salicide blocking layer 61 may block the formation of the silicide on certain areas of the top surface 11. The doped regions 30, 40 may provide a terminal 60 of the structure 10, and the doped regions 36, 44 may provide another terminal 62 of the structure 10. The interconnect structure includes an electrical connection 64 to the doped regions 30, 40 and a separate electrical connection 66 to the doped regions 36, 44. In an embodiment, the terminal 60 may be the anode of the structure 10, and the terminal 62 may be the cathode of the structure 10. In an embodiment, a bias may be applied at the anode and the cathode may be grounded. The electrical connection 64 also couples the terminal 60 to the doped region 46 and, thereby, couples the terminal 60 to the well 26 and the deep well 20.

The conductor layer 50 is tied to the terminal 60 by the electrical connection 64. Similarly, the conductor layer 52 is tied to the terminal 62 by the electrical connection 66. Hence, when biasing is present, the conductor layer 50 will be biased at the same potential as the terminal 60, and the conductor layer 52 will be biased at the same potential as the terminal 62. The doped region 42 in the well 24, the doped region 32 in the well 22, and the doped region 34 in the well 28 are not connected by the electrical connections 64, 66 to either of the terminals 60, 62, and are floating during use.

The structure 10 may embody a fully-isolated unidirectional device structure for a silicon-controlled rectifier that is suitable for use as electrostatic discharge protection device. Compared to conventional silicon-controlled rectifiers, the structure 10 may be characterized by a reduced trigger voltage, a higher holding voltage, and improved high current performance in response to an electrostatic discharge event. The structure 10 may be used, for example, for either input/output pad protection or power pad protection. The structure 10 may exhibit a reduced on-resistance when triggered, which may permit a reduction in the device footprint.

Figure 2:
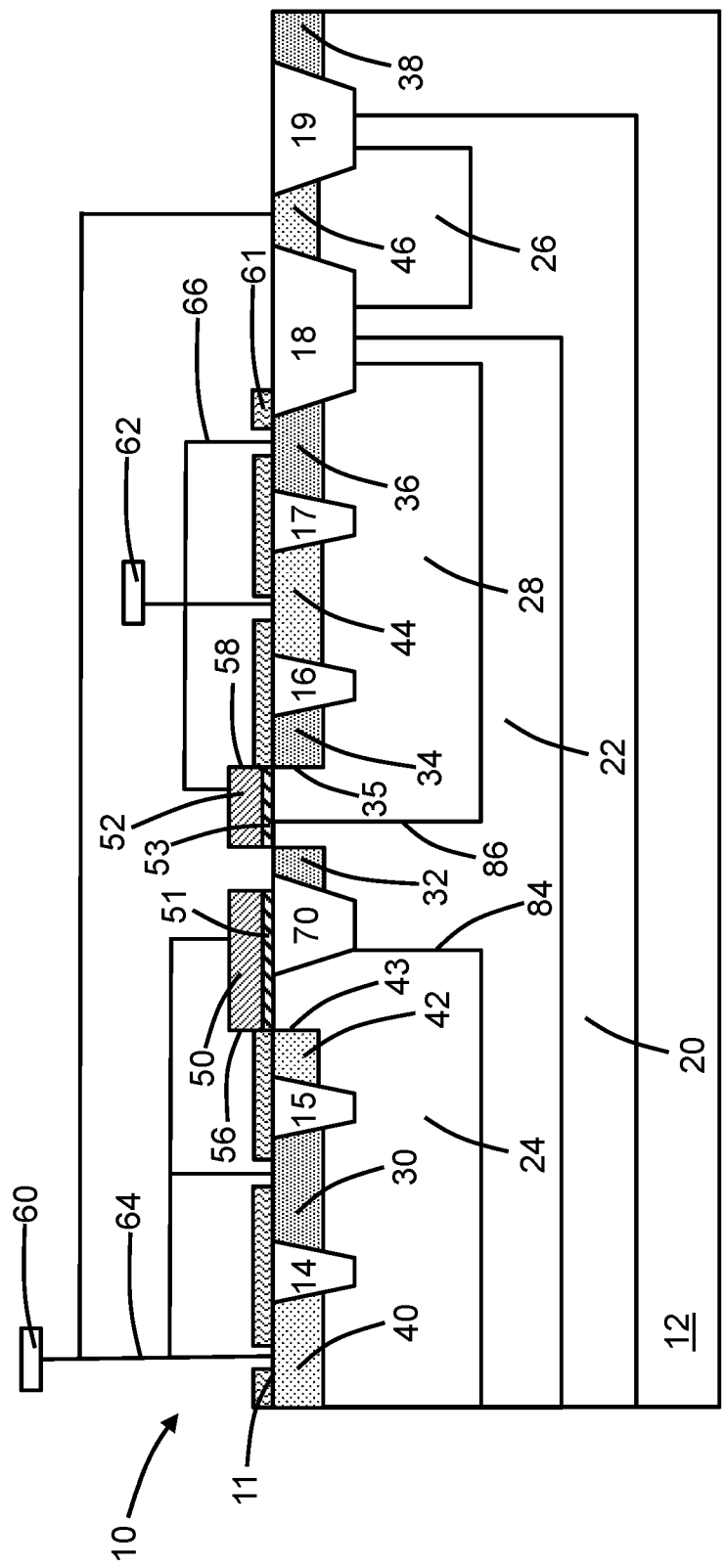
FIG. 2 is a cross-sectional view of a structure in accordance with alternative embodiments of the invention.

With reference to FIG. 2 in which like reference numerals refer to like features in FIG. 1 and in accordance with alternative embodiments of the invention, a shallow trench isolation region 70 may be formed in the semiconductor substrate 12 and positioned in a vertical direction beneath the conductor layer 50. The shallow trench isolation region 70 is positioned in a lateral direction adjacent to the doped region 32 and may adjoin the doped region 32. The shallow trench isolation region 70 may be comprised of a dielectric material, such as silicon dioxide, and may be formed in the same manner as, and concurrently with, the shallow trench isolation regions 14, 15, 16, 17, 18, 19. The conductive layer 50 is positioned on the top surface 11 to overlap with the shallow trench isolation region 70. The shallow trench isolation region 70 may function to increase the breakdown voltage of the structure 10.

Figure 3:
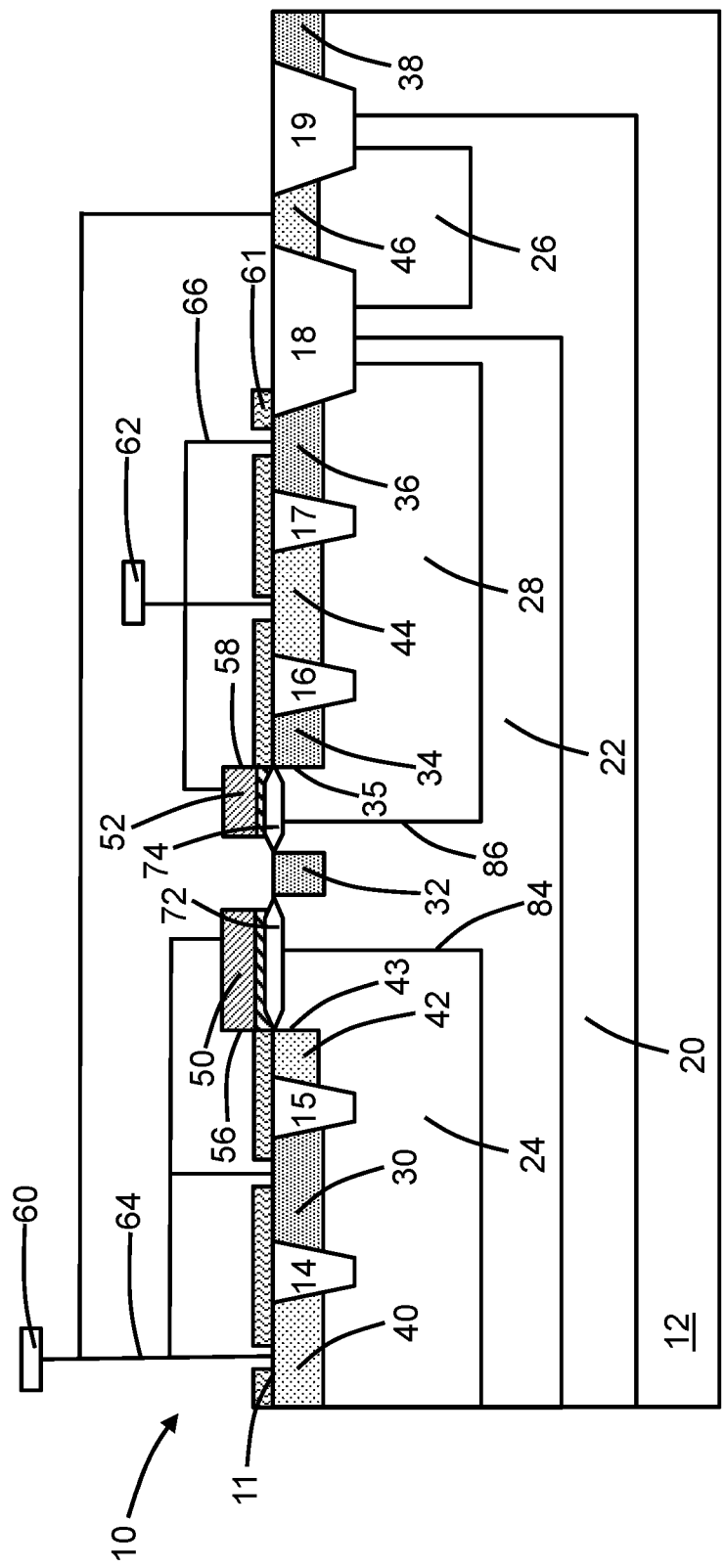
FIG. 3 is a cross-sectional view of a structure in accordance with alternative embodiments of the invention.

With reference to FIG. 3 in which like reference numerals refer to like features in FIG. 2 and in accordance with alternative embodiments of the invention, isolation regions 72, 74 may be formed in the semiconductor substrate 12. The isolation regions 72, 74 may be comprised of a dielectric material, such as silicon dioxide, and may be formed by a local oxidation of silicon (LOCOS) technique. The isolation regions 72, 74 may penetrate to a shallower depth in the semiconductor substrate 12 than the shallow trench isolation regions 14, 15, 16, 17, 18, 19. The conductive layer 50 is positioned on the top surface 11 to overlap with the isolation region 72, and the conductive layer 52 is positioned on the top surface 11 to overlap with the isolation region 74.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:
    a semiconductor substrate;
    a first well in the semiconductor substrate, the first well having a first conductivity type;
    a second well in the semiconductor substrate, the second well having a second conductivity type opposite to the first conductivity type;
    a first terminal including a first doped region in the first well, the first doped region having the second conductivity type;
    a second terminal including a second doped region in the second well, the second doped region having the first conductivity type;
    a first conductor layer on the semiconductor substrate, the first conductor layer including a first portion overlapping with the first well;
    a second conductor layer on the semiconductor substrate, the second conductor layer including a first portion overlapping with the second well; and
    a third doped region in the semiconductor substrate, the third doped region having the second conductivity type, and the third doped region positioned in a lateral direction between the first conductor layer and the second conductor layer.

2. The structure of claim 1 wherein the first conductor layer has a first sidewall, the second conductor layer has a second sidewall, and the third doped region is positioned between the first sidewall and the second sidewall.

3. The structure of claim 2 wherein the third doped region has a first side edge aligned with the first sidewall of the first conductor layer and a second side edge aligned with the second sidewall of the second conductor layer.

4. The structure of claim 1 further comprising:
    a third well having the second conductivity type and a lower dopant concentration than the second well, the third well including a portion positioned in the lateral direction between the first well and the second well,
    wherein the third doped region is positioned in the portion of the third well.

5. The structure of claim 4 wherein the third doped region has a higher dopant concentration than the third well.

6. The structure of claim 4 wherein the first conductor layer includes a second portion overlapping with the portion of the third well, and the first well and the portion of the third well adjoin along an interface that is positioned beneath the first conductor layer.

7. The structure of claim 4 wherein the second conductor layer includes a second portion overlapping with the portion of the third well, and the second well and the portion of the third well adjoin along an interface that is positioned beneath the second conductor layer.

8. The structure of claim 1 wherein the third doped region is not connected to the first terminal, and the third doped region is not connected to the second terminal.

9. The structure of claim 1 wherein the first conductor layer is connected to the first terminal.

10. The structure of claim 1 wherein the second conductor layer is connected to the second terminal.

11. The structure of claim 1 further comprising:
a first dielectric layer positioned between the first conductor layer and the semiconductor substrate; and
a second dielectric layer positioned between the second conductor layer and the semiconductor substrate.

12. The structure of claim 1 further comprising:
a fourth doped region in the first well, the fourth doped region positioned adjacent to the first conductor layer, and the fourth doped region having the first conductivity type and a higher dopant concentration than the first well.

13. The structure of claim 12 wherein the fourth doped region is not connected to the first terminal, and the fourth doped region is not connected to the second terminal.

14. The structure of claim 12 wherein the first conductor layer has a sidewall, and the fourth doped region has a side edge aligned with the sidewall of the first conductor layer.

15. The structure of claim 1 further comprising:
a fourth doped region in the second well, the fourth doped region positioned adjacent to the second conductor layer, and the fourth doped region having the second conductivity type and a higher dopant concentration than the second well.

16. The structure of claim 15 wherein the fourth doped region is not connected to the first terminal, and the fourth doped region is not connected to the second terminal.

17. The structure of claim 15 wherein the second conductor layer has a sidewall, and the fourth doped region has an edge aligned with the sidewall of the second conductor layer.

18. The structure of claim 1 further comprising:
a first isolation region in the semiconductor substrate beneath the first conductor layer, the first isolation region comprising a dielectric material.

19. The structure of claim 18 further comprising:
a second isolation region in the semiconductor substrate beneath the second conductor layer, the second isolation region comprising the dielectric material.

20. A method of forming a structure for a silicon-controlled rectifier, the method comprising:
forming a first well in a semiconductor substrate, wherein the first well has a first conductivity type;
forming a second well in the semiconductor substrate, wherein the second well has a second conductivity type opposite to the first conductivity type;
forming a first terminal including a first doped region in the first well, wherein the first doped region has the second conductivity type;
forming a second terminal including a second doped region in the second well, wherein the second doped region has the first conductivity type;
forming a first conductor layer on the semiconductor substrate, wherein the first conductor layer includes a portion overlapping with the first well;
forming a second conductor layer on the semiconductor substrate, wherein the second conductor layer includes a portion overlapping with the second well; and
forming a third doped region in the semiconductor substrate, wherein the third doped region has the second conductivity type, and the third doped region is positioned in a lateral direction between the first conductor layer and the second conductor layer.

\* \* \* \* \*